United States Patent
Matsumoto et al.

(10) Patent No.: US 8,501,021 B2
(45) Date of Patent: *Aug. 6, 2013

(54) PROCESS AND SYSTEM FOR QUALITY MANAGEMENT AND ANALYSIS OF VIA DRILLING

(75) Inventors: Hisashi Matsumoto, Hillsboro, OR (US); Mark Singer, Tualatin, OR (US); Leo Baldwin, Portland, OR (US); Jeffrey E. Howerton, Portland, OR (US); David V. Childers, Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 1079 days.

This patent is subject to a terminal disclaimer.

(21) Appl. No.: 12/412,853

(22) Filed: Mar. 27, 2009

(65) Prior Publication Data
US 2009/0179017 A1    Jul. 16, 2009

Related U.S. Application Data

(63) Continuation of application No. 11/484,531, filed on Jul. 11, 2006, now Pat. No. 7,544,304.

(51) Int. Cl.
*H01B 13/00* (2006.01)
(52) U.S. Cl.
USPC .............. 216/13; 216/15; 216/18; 257/739; 438/612
(58) Field of Classification Search
USPC ....... 216/12, 13, 17, 18, 15, 19, 20; 257/686, 257/690, 737, 739; 438/629, 638, 612
See application file for complete search history.

(56) References Cited

U.S. PATENT DOCUMENTS

| | | | |
|---|---|---|---|
| 5,227,614 A | 7/1993 | Danielson et al. | |
| 5,243,140 A | 9/1993 | Bhatia et al. | |
| 5,293,025 A | 3/1994 | Wang | |
| 5,438,186 A | 8/1995 | Nair et al. | |
| 5,444,616 A | 8/1995 | Nair et al. | |
| 5,448,044 A | 9/1995 | Price et al. | |
| 5,448,047 A | 9/1995 | Nair et al. | |
| 5,464,682 A | 11/1995 | Perfecto et al. | |
| 5,518,964 A | 5/1996 | DiStefano et al. | |
| 5,561,282 A | 10/1996 | Price et al. | |
| 5,614,114 A | 3/1997 | Owen | |
| 5,672,083 A | 9/1997 | Curtin et al. | |
| 5,686,790 A | 11/1997 | Curtin et al. | |

(Continued)

*Primary Examiner* — Lan Vinh
(74) *Attorney, Agent, or Firm* — Young Basile

(57) ABSTRACT

A process for laser forming a blind via in at least one layer of a circuit substrate having a plurality of capture pads of varying geometry can include, for at least one blind via to be formed in at least one layer of a circuit substrate, evaluating a capture pad geometry value (such as area and/or volume) within a predetermined distance from a drilling location with respect to a blind via geometry value (such as area and/or volume) to be formed at the drilling location. The process can include setting at least one laser operating parameter based on the evaluation in order to obtain a desired capture pad appearance after blind via formation. The process can include imaging a capture pad area defined as an area within a predetermined distance from a blind via drilling location in at least one layer of a circuit substrate, quantifying at least one appearance value for the imaged capture pad area, and determining an acceptability of the imaged capture pad areas based on the quantified appearance value.

19 Claims, 4 Drawing Sheets

(56) References Cited

U.S. PATENT DOCUMENTS

| | | |
|---|---|---|
| 5,699,613 A | 12/1997 | Chong et al. |
| 5,724,889 A | 3/1998 | Aun et al. |
| 5,747,095 A | 5/1998 | McAllister et al. |
| 5,757,079 A | 5/1998 | McAllister et al. |
| 5,787,578 A | 8/1998 | Farooq et al. |
| 5,801,441 A | 9/1998 | DiStefano et al. |
| 5,813,331 A | 9/1998 | Tan et al. |
| 5,818,528 A | 10/1998 | Roth et al. |
| 5,830,782 A | 11/1998 | Smith et al. |
| 5,959,354 A | 9/1999 | Smith et al. |
| 6,021,564 A | 2/2000 | Hanson |
| 6,072,144 A | 6/2000 | Perryman |
| 6,104,087 A | 8/2000 | DiStefano et al. |
| 6,141,046 A | 10/2000 | Roth et al. |
| 6,194,291 B1 | 2/2001 | DiStefano et al. |
| 6,211,485 B1 | 4/2001 | Burgess |
| 6,235,544 B1 | 5/2001 | Franklin et al. |
| 6,285,916 B1 | 9/2001 | Kadaba et al. |
| 6,427,324 B1 | 8/2002 | Franklin et al. |
| 6,534,743 B2 | 3/2003 | Swenson et al. |
| 6,541,709 B1 | 4/2003 | Franklin et al. |
| 6,541,712 B1 | 4/2003 | Gately et al. |
| 6,576,869 B1 | 6/2003 | Gower et al. |
| 6,631,558 B2 | 10/2003 | Burgess |
| 6,633,376 B1 | 10/2003 | Nishida et al. |
| 6,635,553 B1 | 10/2003 | DiStefano et al. |
| 6,838,314 B2 | 1/2005 | Chang |
| 6,881,662 B2 | 4/2005 | Kung et al. |
| 7,060,595 B2 | 6/2006 | Ou et al. |
| 7,544,304 B2 * | 6/2009 | Matsumoto et al. ............ 216/13 |
| 2001/0045611 A1 | 11/2001 | Clatanoff et al. |
| 2002/0021138 A1 * | 2/2002 | Budnaitis et al. ............. 324/760 |
| 2002/0113312 A1 | 8/2002 | Clatanoff et al. |
| 2002/0145203 A1 | 10/2002 | Adae-Amoakoh et al. |
| 2003/0066679 A1 | 4/2003 | Castro et al. |
| 2003/0067730 A1 | 4/2003 | Anthony et al. |
| 2003/0183418 A1 | 10/2003 | Castro et al. |
| 2003/0190799 A1 | 10/2003 | Kung et al. |
| 2003/0196987 A1 | 10/2003 | Kung et al. |
| 2003/0206388 A9 | 11/2003 | Anthony et al. |
| 2004/0099960 A1 | 5/2004 | Adae-Amoakoh et al. |
| 2004/0112881 A1 | 6/2004 | Bloemeke et al. |
| 2004/0140560 A1 | 7/2004 | Harvey |
| 2004/0146917 A1 | 7/2004 | Cork et al. |
| 2004/0258310 A1 | 12/2004 | Giger et al. |
| 2005/0077083 A1 | 4/2005 | Mattix |
| 2005/0169514 A1 | 8/2005 | Prince |
| 2005/0176272 A1 | 8/2005 | Rosenau |
| 2005/0189656 A1 | 9/2005 | Tan |
| 2005/0190959 A1 * | 9/2005 | Kohler et al. ................. 382/147 |
| 2005/0286198 A1 | 12/2005 | Anthony et al. |
| 2006/0028305 A1 * | 2/2006 | Dutta et al. ................... 333/238 |
| 2006/0037192 A1 | 2/2006 | Karkkainen et al. |
| 2006/0091023 A1 | 5/2006 | Bukhari et al. |
| 2008/0179304 A1 | 7/2008 | Osako et al. |
| 2008/0181269 A1 | 7/2008 | Osako et al. |

* cited by examiner

PROCESS AND SYSTEM FOR QUALITY MANAGEMENT AND ANALYSIS OF VIA DRILLING

CROSS-REFERENCE TO RELATED APPLICATION

This application is a continuation of U.S. patent application Ser. No. 11/484,531, filed Jul. 11, 2006.

FIELD OF THE INVENTION

The present invention relates to a process and system for laser forming blind vias in at least one layer of a circuit substrate having a plurality of capture pads of varying geometry.

BACKGROUND OF THE INVENTION

The use of a pre-etched window as a mask for laser drilling blind vias in a multi-layer circuit board is generally known. Dense pin count and/or dense component placement on multi-layer circuit boards or polymer based multi-chip modules can create an interconnect density problem referred to in the industry as "via starvation". One solution to the problem of "via starvation" is the formation of blind vias interconnecting one or more layers in a multi-layer circuit board or multi-chip module.

One quality criterion in blind via formation is copper capture pad appearance. Capture pad appearance is sometimes referred to as "shiny", "melted too much" or "dark", and tends to be a very subjective criterion. Some customers specify the desired process parameter by this subjective measure in addition to throughput considerations. It has been observed that laser operating parameters affect the appearance of the copper capture pad. For high fluence process, the pad tends to be melted showing a "shiny" appearance. When the fluence is set very low, the appearance is somewhat "dark". The number of pulses applied to the material can also affect the appearance. Another observation is that the appearance varies depending on the laser operating parameter or characteristics, such as pulse width. It has also been observed that the appearance varies depending on the capture pad geometry even when the same laser processing parameters are used. When a variation in quality is observed in the entire panel process, it is sometimes difficult to resolve the source of the quality variation, since data coming from the computer aided design (CAD) system relates only to the desired drilling location.

Ultraviolet (UV) laser and image projection processing has been used for drilling blind via in integrated circuits (IC) packaging substrates. The current process typically applies a single set of laser operating parameters to all vias or holes that are intended to yield the same geometry between two layers in a printed circuit design. However, due to varying capture pad geometry, the end results are sometimes less than desirable. When applying a fixed set of laser operating parameters, the results vary from "dark" copper when drilling in a solid copper plane, to delaminated copper on 110 micrometer (Mm) copper capture pads.

SUMMARY OF THE INVENTION

A process for laser forming a blind via in at least one layer of a circuit substrate having a plurality of capture pads of varying geometry can include for at least one blind via to be formed in at least one layer of a circuit substrate, evaluating a capture pad geometry value (such as area and/or volume) within a predetermined distance from a drilling location with respect to a blind via geometry value (such as area and/or volume) to be formed at the drilling location. The process can also include setting at least one laser operating parameter based on the evaluation in order to obtain a desired capture pad appearance after blind via formation.

A process for laser forming a blind via in at least one layer of a circuit substrate having a plurality of capture pads of varying geometry can include imaging a capture pad area defined as an area within a predetermined distance from a blind via drilling location in at least one layer of a circuit substrate, quantifying an appearance value for the imaged capture pad area, and determining acceptability of the imaged capture pad area based on the quantified appearance value.

Other applications of the present invention will become apparent to those skilled in the art when the following description of the best mode contemplated for practicing the invention is read in conjunction with the accompanying drawings.

BRIEF DESCRIPTION OF THE DRAWINGS

The description herein makes reference to the accompanying drawings wherein like reference numerals refer to like parts throughout the several views, and wherein.

DETAILED DESCRIPTION

Figure 1:
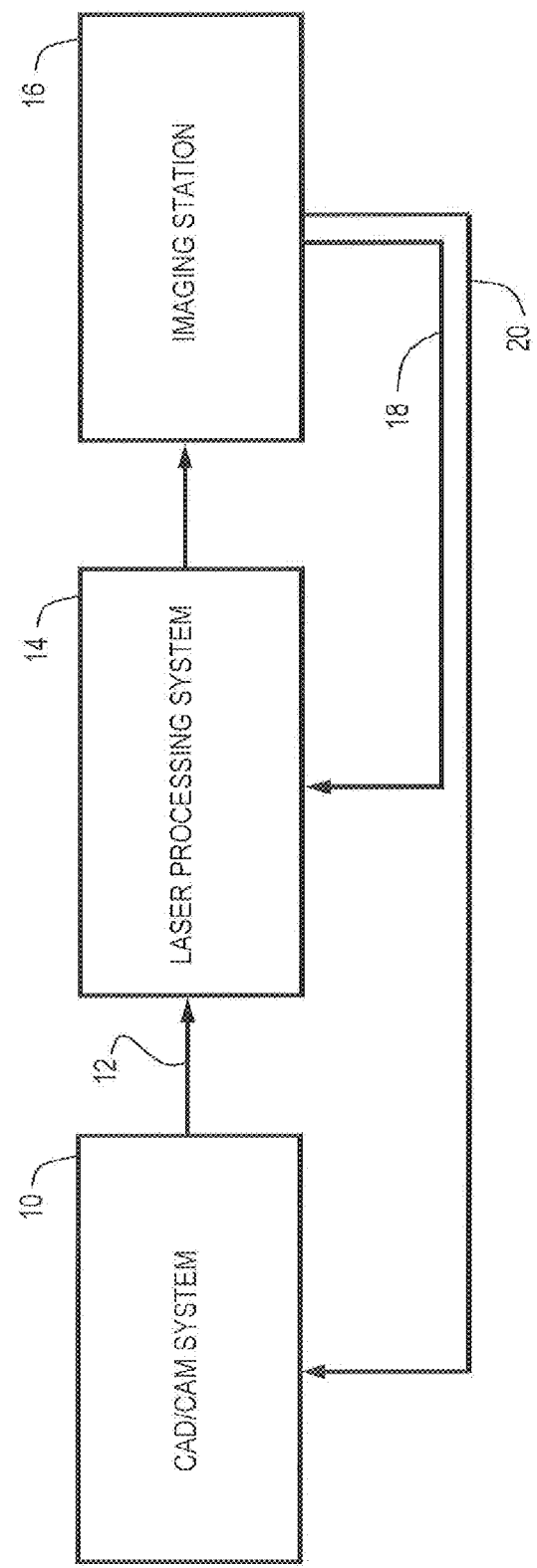
FIG. 1 is a simplified schematic view of a system for laser forming vias in at least one layer of a circuit substrate having a plurality of capture pads of varying geometry.

Referring now to FIG. 1, a process or method for quality management and analysis of blind via can include a CAD/CAM system 10 including circuit layout design data. The CAD design data can include at least one layer of a circuit substrate having a plurality of capture pads of varying geometry including drilling locations and sizes for forming vias and/or blind vias therein. The CAD design data can be transferred by any suitable means, schematically illustrated as arrow 12, to a laser processing system 14. Using the location of a via and/or a blind via to be drilled and pad location and/or geometry as a reference image, laser operating parameters can be set or associated with the CAD design data received from the CAD/CAM system in order to laser form a via or blind via in at least one layer of the circuit substrate. The process can then include an imaging device or station 16 located in-line (or on-line) or off-line, to analyze pad and via location to generate a quality index or appearance value. Quality index value information can be fed back to the laser processing system 14 through any suitable means, schematically illustrated as arrow 18 for laser operating parameter verification, adjustment or optimization, and/or can be fed back to the CAD/CAM system 10 through any suitable means, schematically illustrated as arrow 20, for verification, adjustment or optimization of the location/geometry of formed via and capture pads, and for mapping quality index or appearance values corresponding to each location/geometry.

It should be recognized that the present invention can be used for quality management and analysis and/or as a feedback signal to the prior design and/or processing systems in order to verify and/or adjust current locations, geometries and/or operating parameters in order to obtain a desired capture pad appearance after blind via formation.

Figure 2:
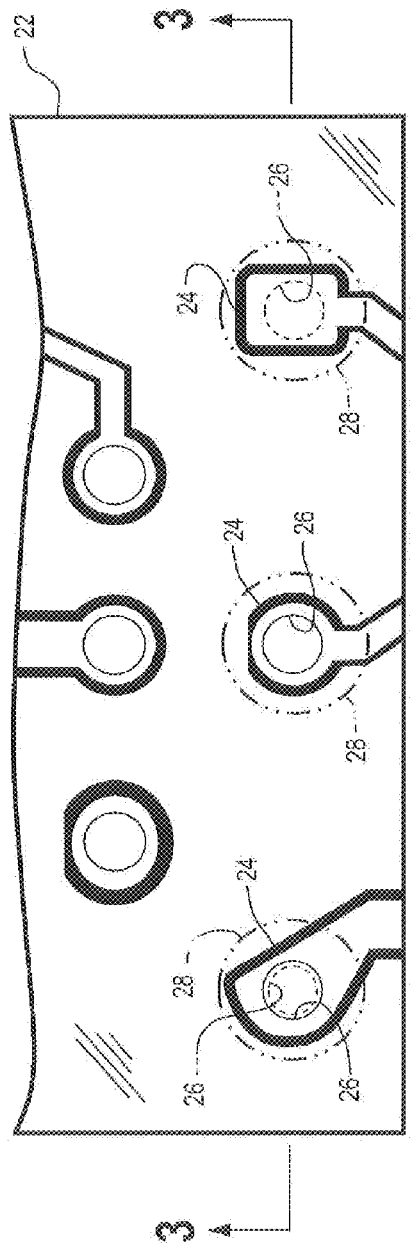
FIG. 2 is a detail of a CAD/CAM circuit layout pattern having a plurality of capture pads of varying geometry, where a blind via is to be drilled in a center of a capture pad, and where a phantom circle defines a capture pad area within a predetermined distance from a drilling location.
Figure 3:
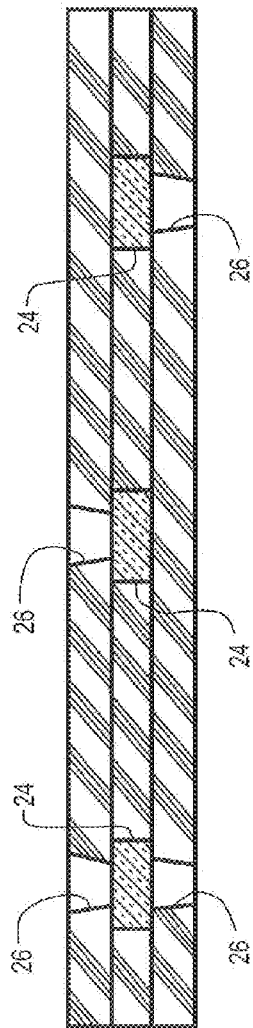
FIG. 3 is a cross-sectional view taken as shown in FIG. 2 illustrating stacked vias and vias drilled in a plurality of capture pads of varying geometry.

Referring now to FIGS. 2 and 3, a CAD/CAM circuit layout pattern 22 is illustrated in detail where a plurality of capture pads 24 of varying geometry are to be formed with a blind via 26 in a drilling location associated with the capture pad 24. The outer phantom perimeter 28 illustrates a radial distance or other predetermined distance for analysis where copper capture pad appearance is not affected outside the boundary of perimeter 28. Copper pad geometry data, along with via drilling size, can be used to evaluate a capture pad geometry value connected to a drilling location within a predetermined distance from the drilling location versus a blind via geometry value to be formed at the drilling location. The evaluation can include value comparison, and/or lookup tables, and/or calculations, or the like.

By way of example and not limitation, a ratio of capture pad geometry value to blind via geometry value is calculated in order to rank the ratios into predetermined ranges associated with the use of different laser processing parameters. The CAD system 10 sends blind via drill location/geometry information, capture pad location/geometry information and/or pad/via geometry ratio or corresponding laser operating parameters to the laser drill system 14. Alternatively, an evaluation of the capture pad geometry value with respect to the blind via geometry value is performed and/or the values are ranked by the laser drill system, so that different laser operating parameters can be applied.

Alternatively, the CAD system can segregate a geometry value, such as a single-tool drill file, into a multi-tool drill file based on the evaluation of capture pad geometry value (such as area and/or volume) with respect to blind via geometry value (such as area and/or volume), as evaluated in the CAD system. The analysis can also include a comparison to previous drill steps to determine if stacked vias (such as that illustrated to the left of FIG. 3) are present.

By way of example and not limitation, separate laser drill files are generated based on capture pad geometry value to blind via geometry value ratios ranked into different groups to set different laser operating parameters for each group, such as a destination layer, laser fluence, number of pulses, pulse width, or any combination thereof. By way of example and not limitation, stacked blind vias can be assigned a destination layer value of 14; ratios in the range of 1% to 13% are assigned a destination layer value of 15; ratios greater than 13% and up to 17% are assigned a destination layer value of 16; ratios greater than 17% and up to 20% are assigned a destination layer value of 17; and ratios greater than 20% and up to 100% are assigned a destination of layer value of 18. A multi tool drill file is generated based on the ratio of via geometry value (e.g. area or volume) versus capture pad geometry (e.g. area or volume) as evaluated in the CAD system, or in the laser processing system, or any combination thereof.

Figure 4:
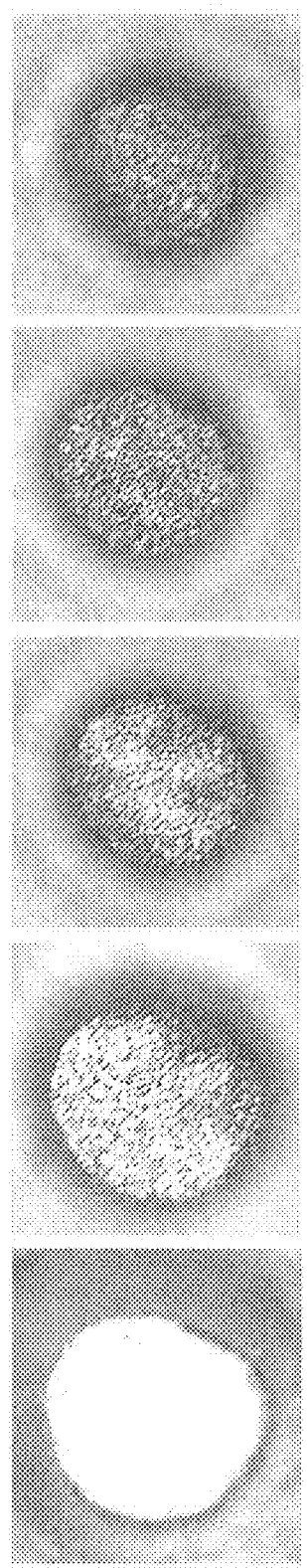
FIGS. 4A through 4E illustrate a comparison of copper appearance in drilled blind via using different laser operating parameters, or applying a fixed set of laser operating parameters to capture pads of varying geometry, where FIG. 4A corresponds to a subjective "shiny" surface texture, FIG. 4C corresponds to a subjective "matt" or "grainy" surface texture and FIG. 4E corresponds to a subjective "dark" surface texture.

The imaging device or station 16 can evaluate and quantify an appearance of the capture pad after via formation. As seen in FIGS. 4A through 4E, when applying a fixed set of laser processing parameters, the appearance of the capture pad can vary from "dark" copper when drilling in a solid copper plane (illustrated in FIG. 4E) to delaminated copper on 110 micrometer (μm) copper pads (illustrated in FIG. 4A). Copper appearances can also vary in drilled blind via using different laser parameters. For example, the appearance illustrated in FIG. 4A is typically referred to by the descriptive subjective term "shiny" surface texture. The copper appearance illustrated in FIG. 4C is typically referred to by the descriptive subjective term "matt" or "grainy" surface texture. The copper appearance illustrated in FIG. 4E is typically referred to by the descriptive subjective term "dark" surface texture. FIG. 4B illustrates a copper appearance that falls between what is subjectively referred to as "shiny" and "matt" surface textures. FIG. 4D illustrates a copper appearance that falls between the subjective description of "dark" and "matt" surface textures.

The subjective character of the terms used to describe the copper capture pad appearance after blind via formation has hindered quality control and processing control efforts. The present invention according to one embodiment uses the vision system 16 to quantify an appearance of the capture pad. This enables a user to reference copper appearance as a number, rather than as merely a descriptive subjective term.

The process or method according to one embodiment of the present invention includes performing a histogram analysis and/or fractal dimension analysis to provide at least one numerical appearance value. For example, if the "matt" or "grainy" surface texture of a copper capture pad is preserved during laser machining of a blind via, then the fractal dimension is high (salt and pepper effect), and the intensity distribution in the histogram is bimodal with roughly equal area in each intensity group. Accordingly, the properties of an image of a capture pad can be quantified by a number for fractal dimension and/or by a number for the symmetry between two populations in the histogram. For example, a higher fractal dimension value corresponds to a "matt" or "grainy" surface texture of a copper capture pad, while a lower fractal dimension value corresponds to a "shiny" surface texture of a copper capture pad. Also, a histogram value approximating unity (one) can correspond to a "matt" or "grainy" surface texture of a copper capture pad. In this case, for example, a histogram value less than unity (one) corresponds to a "shiny" surface texture or a copper capture pad, while a histogram value greater than unity (one) corresponds to a "dark" surface texture of a copper capture pad.

The quantified numbers are transferred back to the laser processing system 14 and/or CAD/CAM system 10 to verify, adjust and/or optimize the laser processing parameters in order to minimize the quality variance in drilling results over an entire circuit pattern. The CAD/CAM system can analyze a relation between pad geometry and via quality with the quantified numbers from the vision imaging device or station 16. The vision imaging device or a station 16 can also perform other measurements, such as top/bottom diameter and circularity measurements.

Figure 5:
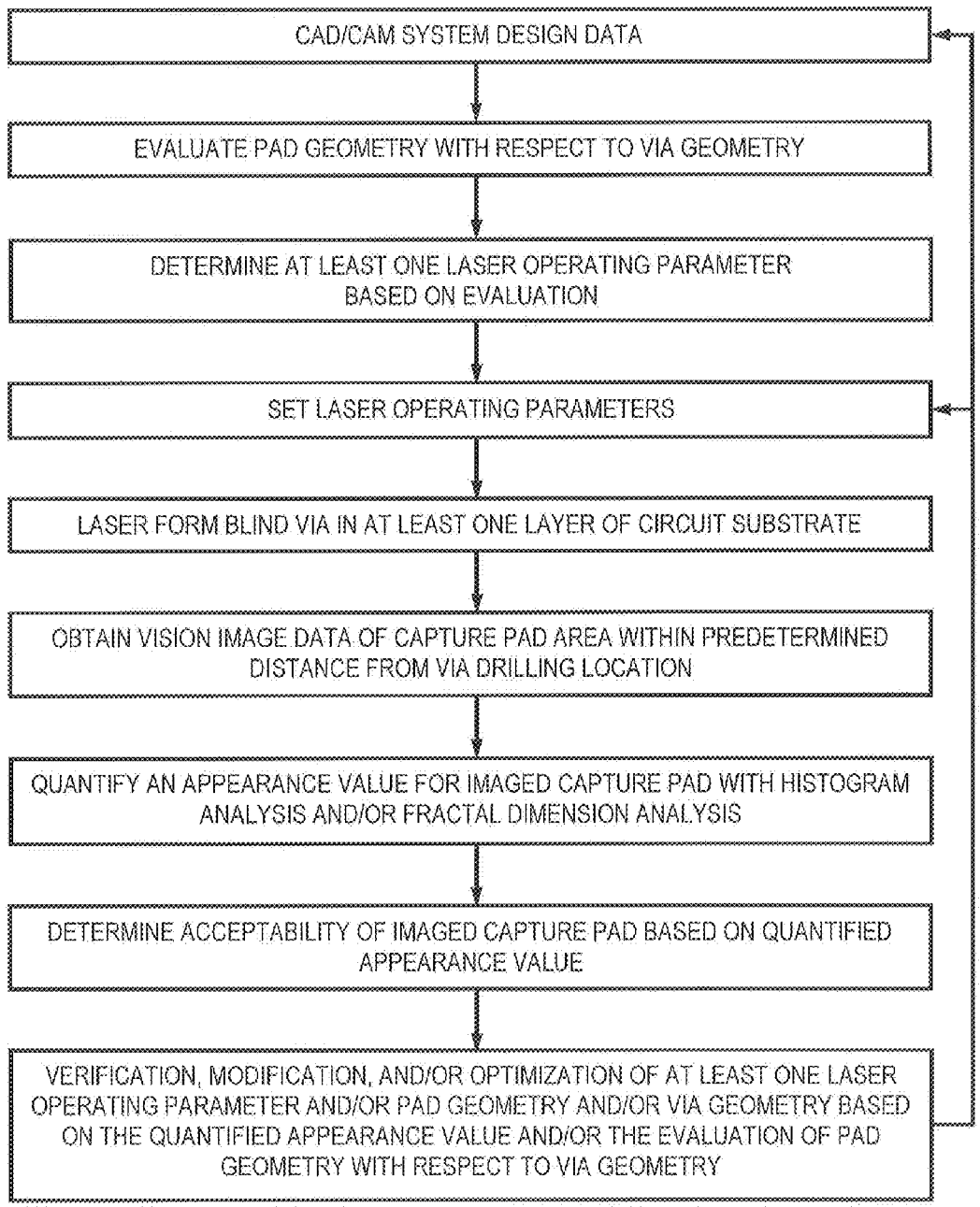
FIG. 5 illustrates a simplified schematic flow diagram of a process for laser forming a blind via in at least one layer of a circuit substrate having a plurality of capture pads of varying geometry.

In operation, and referring now to FIG. 5, a process for laser forming a blind via in at least one layer of a circuit substrate having a plurality of capture pads of varying geometry includes, for at least one blind via to be formed in at least one layer of a circuit substrate, evaluating a capture pad geometry value (such as area and/or volume) within predetermined distance from a drilling location with respect to a blind via geometry value (such as area and/or volume) to be formed at the drilling location. Then, at least one laser operating parameter is set based on the evaluation in order to obtain a desired capture pad appearance after blind via formation. The at least one laser process parameter to be set can be selected from a group consisting of laser fluence, number of laser pulses, laser pulse width and any combination thereof. The process can optionally include comparing a given drill layer to an adjacent drill layer to determine if blind vias are stacked one on top of another.

The process according to one embodiment of the present invention can include defining a drill layer, defining a scan area adjacent a drill location in the defined drill layer, defining a set of evaluation ranges, wherein the evaluation ranges can include calculated ratios defined as a capture pad geometry value (such as area and/or volume) within a predetermined distance from a drilling location with respect to a blind via geometry value (such as area and/or volume) to be formed at the drilling location, and selecting a destination layer for drill tools corresponding to a particular set of ratio ranges.

A process according to one embodiment of the present invention can include imaging a capture pad area defined as an area within a predetermined distance from a blind via drilling location in at least one layer of a circuit substrate, quantifying an appearance value for the imaged capture pad area, and determining acceptability of the imaged capture pad area based on the quantified appearance value. The appearance value can be quantified as a numeric appearance value for the imaged capture pad area to minimize subjectivity in a quality judgment of a laser-formed blind via in the imaged capture pad area. The numeric appearance value can be obtained according to an embodiment of the present invention by performing a fractal dimension analysis on the imaged capture pad area to obtain a numeric value for fractal dimension, where a higher value corresponds to a subjective "matt" or "grainy" surface texture and a lower value correspondence to a subjective "shiny" surface texture for the imaged capture pad area. The numeric appearance value can be obtained according to an embodiment of the present invention by performing a histogram analysis on the imaged capture pad area to obtain a numeric value for symmetry between populations in the histogram, where a value approximating unity (one) corresponds to a subjective "matt" or "grainy" surface texture, a value smaller than unity (one) corresponds to a subjective "shiny" surface texture and a value greater than unity (one) corresponds to a subjective "dark" surface texture of the imaged capture pad area. The numerical appearance value according to an embodiment of the present invention can include performing a histogram analysis and a fractal dimension analysis on the imaged capture pad area to quantify one or more numeric appearance values for the image capture pad area.

Acceptability of the imaged capture pad area according to an embodiment of the present invention can be based on the quantified appearance value. The process can include analyzing a relationship between capture pad geometry value (such as area and/or volume) with respect to blind via geometry value (such as area and/or volume) for evaluation/comparison with respect to at least one appearance value for a plurality of imaged capture pad areas to minimize variance in quality of laser formed blind via over an entire circuit pattern. At least one laser processing parameter can be verified, adjusted, and/or optimized based on the relationship analyzed between the capture pad geometry value (such as area and/or volume) with respect to blind via geometry value (such as area and/or volume) and at least one appearance value for a plurality of captured pad areas with laser formed blind via located in the imaged capture pad areas.

While the invention has been described in connection with what is presently considered to be the most practical and preferred embodiment, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. A process for laser drilling blind vias in at least one layer of a circuit substrate having a plurality of capture pads of varying geometry, comprising:
    before blind via drilling, evaluating a relationship between a capture pad geometry value within a predetermined distance from a drilling location of a capture pad with respect to a blind via geometry value for a blind via to be drilled at the drilling location; and
    setting at least one laser operating parameter based on a result of the evaluation in order to obtain a desired capture pad appearance after blind via drilling, wherein the desired capture pad appearance is a subjective surface texture of the capture pad after blind via drilling.

2. The process of claim 1 wherein the at least one laser process parameter to be set comprises at least one of laser fluence, number of laser pulses and laser pulse width.

3. The process of claim 1, further comprising:
    comparing an anticipated blind via location on a given drill layer to an anticipated blind via location on an adjacent drill layer to determine if blind vias are stacked from layer to layer.

4. The process of claim 1, further comprising:
    analyzing a capture pad appearance after blind via drilling.

5. The process of claim 1 wherein evaluating the capture pad geometry value comprises:
    calculating a ratio of the capture pad geometry value within the predetermined distance from the drilling location with respect to the blind via geometry value to be drilled at the drilling location for each blind via to be drilled in the at least one layer of the circuit substrate.

6. The process of claim 1, further comprising:
    laser drilling the blind via in the capture pad using the at least one laser operating parameter.

7. The process of claim 1, further comprising:
    comparing an actual blind via location on a given drill layer to an actual blind via location on an adjacent drill layer to determine if blind vias are stacked from layer to layer.

8. The process of claim 1 wherein setting at least one laser parameter based on a result of the analysis of the capture pad appearance comprises:
    adjusting at least one laser process parameter based on analyzed capture pad appearance for a plurality of capture pad areas with drilled blind vias located in the plurality of capture pad areas.

9. The process of claim 1 wherein setting at least one laser parameter comprises:
    adjusting at least one laser process parameter based on feedback from a relationship between a ratio of capture pad geometry value to blind via geometry value and an analyzed capture pad appearance for a plurality of capture pad areas with drilled blind vias located in the plurality of capture pad areas.

10. The process of claim 9 wherein the at least one laser process parameter to be set comprises at least one of laser fluence, number of laser pulses and laser pulse width.

11. The process or claim 1 wherein the subjective surface texture of the capture pad is represented by a number.

12. The process of claim 11 wherein the number corresponds to a numerical appearance value calculated by performing at least one of a histogram analysis or a fractal dimension analysis of an image of the capture pad after blind via drilling.

13. The process of claim 1 wherein analyzing a capture pad appearance after blind via drilling comprises:
    imaging a capture pad area defined as an area within a predetermined distance from a blind via drilling location in at least one layer of a circuit substrate; and
    quantifying an appearance value for the imaged capture pad area as a numerical appearance value indicative of a subjective surface texture of the imaged capture pad area.

14. The process of claim 13 wherein quantifying the appearance value comprises:
    performing a fractal dimension analysis on the imaged capture pad area to obtain the numerical appearance value as a fractal dimension, wherein a level of the numerical appearance value corresponds to one of a plurality of subjective surface textures for the imaged capture pad area.

15. The process of claim 13 wherein quantifying the appearance value comprises:
    performing a histogram analysis on the imaged capture pad area to obtain the numerical appearance value as a symmetry between populations in the histogram, wherein the symmetry corresponds to one of a plurality of subjective surface textures for the imaged capture pad area.

16. The process of claim 13, further comprising:
    determining acceptability of the imaged capture pad area based on the quantified appearance value.

17. The process of claim 13 wherein quantifying the appearance value comprises performing at least one of a histogram analysis or a fractal dimension analysis of the imaged capture pad area.

18. A process for laser forming a blind via in at least one layer of a circuit substrate having a plurality of capture pads of varying geometry, comprising:
    before blind via drilling and for at least one blind via to be drilled in at least one layer of a circuit substrate, evaluating a capture pad geometry value within a predetermined distance from a drilling location with respect to a blind via geometry value to be drilled at the drilling location; and
    setting at least one laser operating parameter based on a result of the evaluation in order to obtain a desired capture pad appearance after blind via drilling; and
    analyzing a capture pad appearance after blind via drilling, wherein analyzing the capture pad appearance after blind via drilling comprises:
    imaging a capture pad area defined as an area within a predetermined distance from a blind via drilling location in at least one layer of a circuit substrate;
    quantifying an appearance value for the imaged capture pad area as a numerical appearance value indicative of a subjective quality judgment of the imaged capture pad area; and
    determining acceptability of the imaged capture pad area based on the quantified appearance value; and wherein quantifying the appearance value comprises:
    performing a fractal dimension analysis on the imaged capture pad area to obtain the numerical appearance value as a fractal dimension, wherein a level of the numerical appearance value corresponds to a subjective surface texture for the imaged capture pad area.

19. A process for laser forming a blind via in at least one layer of a circuit substrate having a plurality of capture pads of varying geometry, comprising:
    before blind via drilling and for at least one blind via to be drilled in at least one layer of a circuit substrate, evaluating a capture pad geometry value within a predetermined distance from a drilling location with respect to a blind via geometry value to be drilled at the drilling location;
    setting at least one laser operating parameter based on a result of the evaluation in order to obtain a desired capture pad appearance after blind via drilling; and
    analyzing a capture pad appearance after blind via drilling, wherein analyzing the capture pad appearance after blind via drilling comprises:
    imaging a capture pad area defined as an area within a predetermined distance from a blind via drilling location in at least one layer of a circuit substrate;
    quantifying an appearance value for the imaged capture pad area as a numerical appearance value indicative of a subjective quality judgment of the imaged capture pad area; and
    determining acceptability of the imaged capture pad area based on the quantified appearance value; and wherein quantifying the appearance value comprises:
    performing a histogram analysis on the imaged capture pad area to obtain the numerical appearance value as a symmetry between populations in the histogram, wherein the symmetry corresponds to a subjective surface texture for the imaged capture pad area.

* * * * *